US012562220B1

(12) United States Patent
Singh et al.

(10) Patent No.: US 12,562,220 B1
(45) Date of Patent: Feb. 24, 2026

(54) DYNAMIC NAND SENSING FOR A MEMORY READ OPERATION

(71) Applicant: Synopsys, Inc., Sunnyvale, CA (US)

(72) Inventors: Ankit Singh, Noida (IN); Shubham Upadhyay, Noida (IN); Jaspreet Singh, Noida (IN); Vivek Kumar Dikshit, Noida (IN); Ravindra Shrivastava, Noida (IN); Anurag Garg, Cupertino, CA (US)

(73) Assignee: Synopsys, Inc., Sunnyvale, CA (US)

( * ) Notice: Subject to any disclaimer, the term of this patent is extended or adjusted under 35 U.S.C. 154(b) by 145 days.

(21) Appl. No.: 18/530,031

(22) Filed: Dec. 5, 2023

(51) Int. Cl.
*G11C 11/00* (2006.01)
*G11C 11/408* (2006.01)
*G11C 11/4094* (2006.01)
*G11C 11/4096* (2006.01)

(52) U.S. Cl.
CPC ...... *G11C 11/4094* (2013.01); *G11C 11/4085* (2013.01); *G11C 11/4096* (2013.01)

(58) Field of Classification Search
CPC . G11C 16/28; G11C 11/5678; G11C 13/0004; G11C 16/08; G11C 16/10; G11C 16/24; G11C 11/5642; G11C 16/26; G11C 11/5621; G11C 11/5628; G11C 11/5635; G11C 2211/5634; G11C 27/005; G11C 11/15; G11C 13/004; G11C 2013/0054; G11C 7/065; G11C 11/1673; G11C 7/06; G11C 7/1006; G11C 11/4091; G11C 11/5607; G11C 13/003; G11C 2213/72; G11C 2213/78; G11C 7/062; G11C 7/14; G11C 11/4097; G11C 11/4076; G11C 11/4096; G11C 13/0002; G11C 13/0007; G11C 13/0023; G11C 13/0028; G11C 16/0425; G11C 16/0483; G11C 16/3459; G11C 16/3481; G11C 16/3486; G11C 2207/002; G11C 2207/2227; G11C 2207/229; G11C 2213/18; G11C 2213/71; G11C 27/02; G11C 7/04; G11C 7/08; G11C 7/10; G11C 7/1027; G11C 7/1048; G11C 7/1051; G11C 7/1063; G11C 7/1069; G11C 7/1078; G11C 7/1096; G11C 7/18; G11C 8/12; G11C 11/4094; G11C 16/0491; G11C 16/32; G11C 2029/1204; G11C 2029/5006; G11C 2207/005; G11C 2207/2254; G11C 29/022; G11C 29/50; G11C 7/067; G11C 7/12; G11C 16/34; G11C 7/00; H04L 25/03878
USPC ...................................................... 365/185.25
See application file for complete search history.

*Primary Examiner* — Thong Q Le
(74) *Attorney, Agent, or Firm* — Weaver Austin Villeneuve & Sampson LLP

(57) ABSTRACT

A circuit includes a first PMOS having a source coupled to a supply voltage and a gate coupled to a first bitline of a first memory cell; a second PMOS having a source coupled to the supply voltage and a gate coupled to a second bitline of a second memory cell; a first NMOS having a drain coupled to drains of the first and second PMOS transistors and a gate coupled to the first bitline; a second NMOS having a drain coupled to a source of the first NMOS and a gate coupled to the second bitline; a third PMOS precharging the first bitline to the supply voltage in response to a first precharge signal; and a fourth PMOS precharging the second bitline to the supply voltage in response to a second precharge signal. In response to the first and second precharge signals, the ground terminal is caused to float.

20 Claims, 7 Drawing Sheets

DYNAMIC NAND SENSING FOR A MEMORY READ OPERATION

TECHNICAL FIELD

The present application relates to semiconductor memories, and more particularly to dynamic sensing of data stored in a static random access memory during a read operation.

BACKGROUND

Semiconductor memories are widely used in electronic devices, such as computers, cell phones, hand-held devices, and the like, to store data. A number of different types of semiconductor memories exist, including volatile and non-volatile memories. A Volatile memory, such as a random-access memory (RAM), dynamic random-access memory (DRAM), static random-access memory (SRAM), and synchronous dynamic random-access memory (SDRAM), requires power to maintain its data. A non-volatile memory, such as a flash memory, retains the stored data in the absence of power.

SUMMARY

A circuit, in accordance with one embodiment of the present disclosure, includes, in part: a first PMOS transistor (alternatively referred to herein as PMOS) having a source terminal coupled to a supply voltage and a gate terminal coupled to a first bitline associated with a first memory cell; a second PMOS transistor having a source terminal coupled to the supply voltage and a gate terminal coupled to a second bitline associated with a second memory cell; a first NMOS transistor (alternatively referred to herein as NMOS) having a drain terminal coupled to drain terminals of the first and second PMOS transistors and a gate terminal coupled to the first bitline; a second NMOS transistor having a drain terminal coupled to a source terminal of the first NMOS transistor and a gate terminal coupled to the second bitline; a third PMOS transistor adapted to precharge the first bitline to the supply voltage in response to assertion of a first precharge signal applied to a gate terminal of the third PMOS transistor; and a fourth PMOS transistor adapted to precharge the second bitline to the supply voltage in response to assertion of a second precharge signal applied to a gate terminal of the fourth PMOS transistor. In response to the assertion of the first and second precharge signals, a ground terminal supplying the ground potential to the circuit is caused to float.

In one embodiment, the circuit further includes, in part, a third NMOS transistor having a drain terminal coupled to a source terminal of the second NMOS transistor, a source terminal coupled to the ground terminal, and a gate terminal receiving the first precharge signal; and a fourth NMOS transistor having a drain terminal coupled to the source terminal of the second NMOS transistor, a source terminal coupled to the ground terminal, and a gate terminal receiving the second precharge signal. During a read operation a first one of the first precharge or the second precharge signals remains asserted and a second one of the first precharge or the second precharge signals is deasserted.

In one embodiment, the first memory cell is disposed in a first bank of a memory array arranged along a plurality of rows and columns. The second memory cell is disposed in a second bank of the memory array. The first memory cell is addressable by a first wordline and the second memory array is addressable by a second wordline.

In one embodiment, the first memory cell and the second memory cell are disposed along a same column of the memory array. In one embodiment, the circuit further includes, in part, a third memory cell disposed in the first bank, addressable by a third wordline, and coupled to the first bitline; and a fourth memory cell disposed in the second bank, addressable by a fourth wordline, and coupled to the second bitline.

In one embodiment, the circuit further includes, in part, a latch adapted to latch an output signal supplied at drain terminal of the first NMOS transistor in response to the first precharge signal, the second precharge signal, a complement of the first precharge signal, and a complement of the second precharge signal.

In one embodiment, the latch includes, in part, a fifth PMOS transistor having a source terminal coupled to the supply voltage and a gate terminal receiving the first precharge signal; a sixth PMOS transistor having a source terminal coupled to a drain terminal of the fifth PMOS transistor, and a gate terminal receiving the second precharge signal; a seventh PMOS transistor having a source terminal coupled to a drain terminal of the sixth PMOS transistor, and a gate terminal receiving the complement of the output signal; a fifth NMOS transistor having a drain terminal coupled to a drain terminal of the seventh PMOS transistor and a gate terminal coupled to the gate terminal of the seventh PMOS transistor; a sixth NMOS transistor having a drain terminal coupled to a source terminal of the fifth NMOS transistor, and a gate terminal receiving the complement of the first precharge signal; and a seventh NMOS transistor having a drain terminal coupled to a source terminal of the sixth NMOS transistor, and a gate terminal receiving the complement of the second precharge signal. In one embodiment, each of the first, second, third and fourth memory cells is a static random access memory cell.

A method, in accordance with one embodiment of the present disclosure, includes, in part: forming a first PMOS transistor having a source terminal coupled to a supply voltage and a gate terminal coupled to a first bitline associated with a first memory cell; forming a second PMOS transistor having a source terminal coupled to the supply voltage and a gate terminal coupled to a second bitline associated with a second memory cell; forming a first NMOS transistor having a drain terminal coupled to drain terminals of the first and second PMOS transistors and a gate terminal coupled to the first bitline; forming a second NMOS transistor having a drain terminal coupled to a source terminal of the first NMOS transistor and a gate terminal coupled to the second bitline; forming a third PMOS transistor adapted to precharge the first bitline to the supply voltage in response to assertion of a first precharge signal applied to a gate terminal of the third PMOS transistor; and forming a fourth PMOS transistor adapted to precharge the second bitline to the supply voltage in response to assertion of a second precharge signal applied to a gate terminal of the fourth PMOS transistor. In response to the assertion of the first and second precharge signals, a ground terminal supplying a ground potential to the circuit is caused to float.

In one embodiment, the method further includes, in part: forming a third NMOS transistor having a drain terminal coupled to a source terminal of the second NMOS transistor, a source terminal coupled to the ground terminal, and a gate terminal receiving the first precharge signal; and forming a fourth NMOS transistor having a drain terminal coupled to the source terminal of the second NMOS transistor, a source terminal coupled to the ground terminal, and a gate terminal receiving the second precharge signal. During a read operation a first one of the first precharge or the second precharge signals remains asserted and a second one of the first precharge or the second precharge signals is deasserted.

In one embodiment, the first memory cell is disposed in a first bank of a memory array arranged along a plurality of rows and columns. The second memory cell is disposed in a second bank of the memory array. The first memory cell is addressable by a first wordline and the second memory array is addressable by a second wordline. In one embodiment, the first memory cell and the second memory cell are disposed along a same column of the memory array.

In one embodiment, the method further includes, in part, disposing a third memory cell in the first bank, wherein the third memory cell is addressable by a third wordline and is coupled to the first bitline; and disposing a fourth memory cell in the second bank, wherein the fourth memory cell is addressable by a fourth wordline and is coupled to the second bitline. In one embodiment, the method further includes, in part, latching an output signal supplied at drain terminal of the first NMOS transistor in response to the first precharge signal, the second precharge signal, a complement of the first precharge signal, and a complement of the second precharge signal.

In one embodiment, the latching of the output signal is performed by a latch that includes, in part, a fifth PMOS transistor having a source terminal coupled to the supply voltage and a gate terminal receiving the first precharge signal; a sixth PMOS transistor having a source terminal coupled to a drain terminal of the fifth PMOS transistor, and a gate terminal receiving the second precharge signal; a seventh PMOS transistor having a source terminal coupled to a drain terminal of the sixth PMOS transistor, and a gate terminal receiving the complement of the output signal; a fifth NMOS transistor having a drain terminal coupled to a drain terminal of the seventh PMOS transistor and a gate terminal coupled to the gate terminal of the seventh PMOS transistor; a sixth NMOS transistor having a drain terminal coupled to a source terminal of the fifth NMOS transistor, and a gate terminal receiving the complement of the first precharge signal; and a seventh NMOS transistor having a drain terminal coupled to a source terminal of the sixth NMOS transistor, and a gate terminal receiving the complement of the second precharge signal. In one embodiment, each of the first, second, third and fourth memory cells is a static random access memory cell.

A non-transitory computer readable medium includes stored instructions, which when executed by a processor, cause the processor to generate a circuit design. The circuit design includes, in part, a first PMOS transistor having a source terminal coupled to a supply voltage and a gate terminal coupled to a first bitline associated with a first memory cell; a second PMOS transistor having a source terminal coupled to the supply voltage and a gate terminal coupled to a second bitline associated with a second memory cell; a first NMOS transistor having a drain terminal coupled to drain terminals of the first and second PMOS transistors and a gate terminal coupled to the first bitline; a second NMOS transistor having a drain terminal coupled to a source terminal of the first NMOS transistor and a gate terminal coupled to the second bitline; a third PMOS transistor adapted to precharge the first bitline to the supply voltage in response to assertion of a first precharge signal applied to a gate terminal of the third PMOS transistor; and a fourth PMOS transistor adapted to precharge the second bitline to the supply voltage in response to assertion of a second precharge signal applied to a gate terminal of the fourth PMOS transistor. In response to the assertion of the first and second precharge signals, a ground terminal supplying a ground potential to the circuit is caused to float.

In one embodiment, the circuit design further includes, in part: a third NMOS transistor having a drain terminal coupled to a source terminal of the second NMOS transistor, a source terminal coupled to the ground terminal, and a gate terminal receiving the first precharge signal; and a fourth NMOS transistor having a drain terminal coupled to the source terminal of the second NMOS transistor, a source terminal coupled to the ground terminal, and a gate terminal receiving the second precharge signal, wherein during a read operation a first one of the first precharge or the second precharge signals remains asserted and a second one of the first precharge or the second precharge signals is deasserted.

In one embodiment, the first memory cell is disposed in a first bank of a memory array arranged along a plurality of rows and columns, wherein the second memory cell is disposed in a second bank of the memory array, wherein the first memory cell is addressable by a first wordline and the second memory array is addressable by a second wordline. In one embodiment, the first memory cell and the second memory cell are disposed along a same column of the memory array.

DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Demand for storage of data in an on-chip static random access memory (SRAM) continues to grow. An SRAM often includes a multitude of memory cells arranged along a multitude of rows and columns. To access an SRAM cell to perform a memory write operation, signals are applied to the wordline and the bitlines of the selected SRAM cell. To perform a memory read operation, a signal is applied to the wordline of the selected SRAM cell while the bitlines of the SRAM cell are sensed to retrieve the data stored therein. An SRAM may include dual ports to enable a write operation from a first port, and a concurrent read operation from a second port. The read access time in a conventional SRAM is relatively long due to the number of stages that are used to retrieve and latch the stored data.

In accordance with embodiments of the present disclosure, a dynamic NAND sensing circuit performs the read operations in an SRAM. During a read operation, the ground voltage is supplied to the dynamic NAND sensing circuit to enable the readout of the stored data from the selected SRAM cell. During write or standby operations, the terminal supplying the ground voltage is caused to float. The dynamic sensing circuit, in accordance with embodiments of the present disclosure, improves the memory read access time of an SRAM by at least 10%-15% compared to read sensing circuits of conventional SRAMs.

Figure 1:
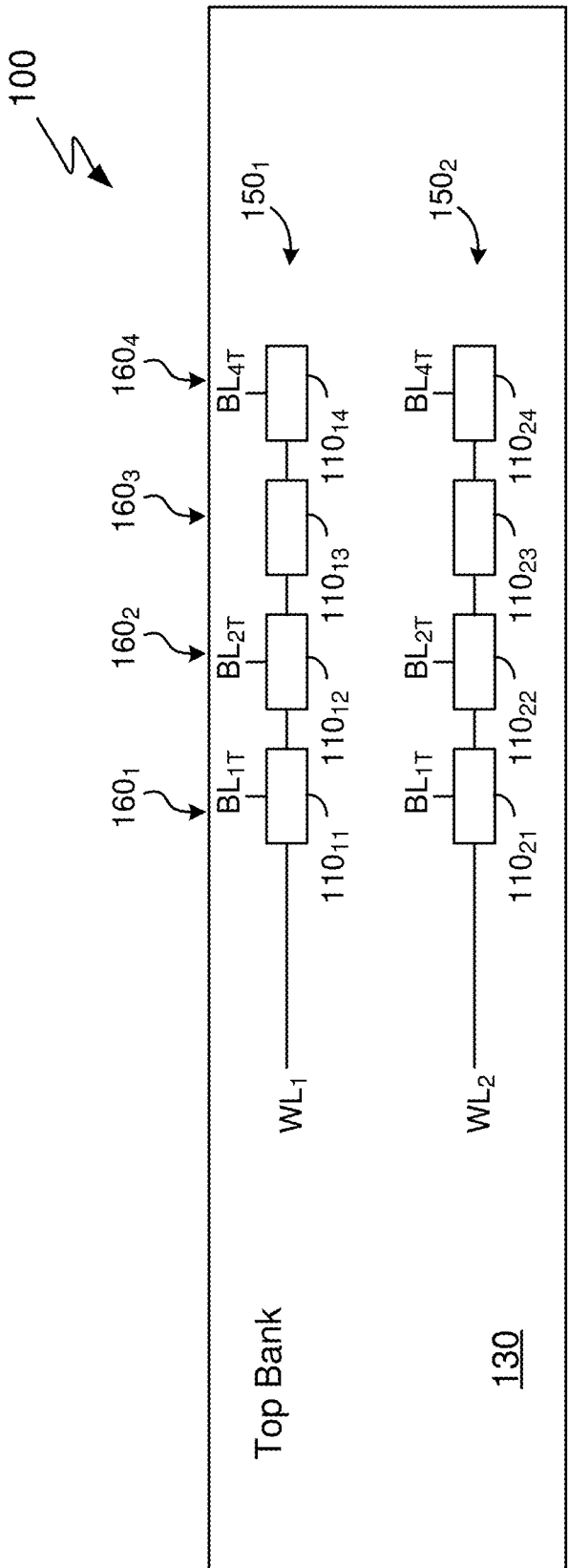
FIG. 1 is a high-level block diagram of an SRAM array, in accordance with one embodiment of the present disclosure.
Figure 1:
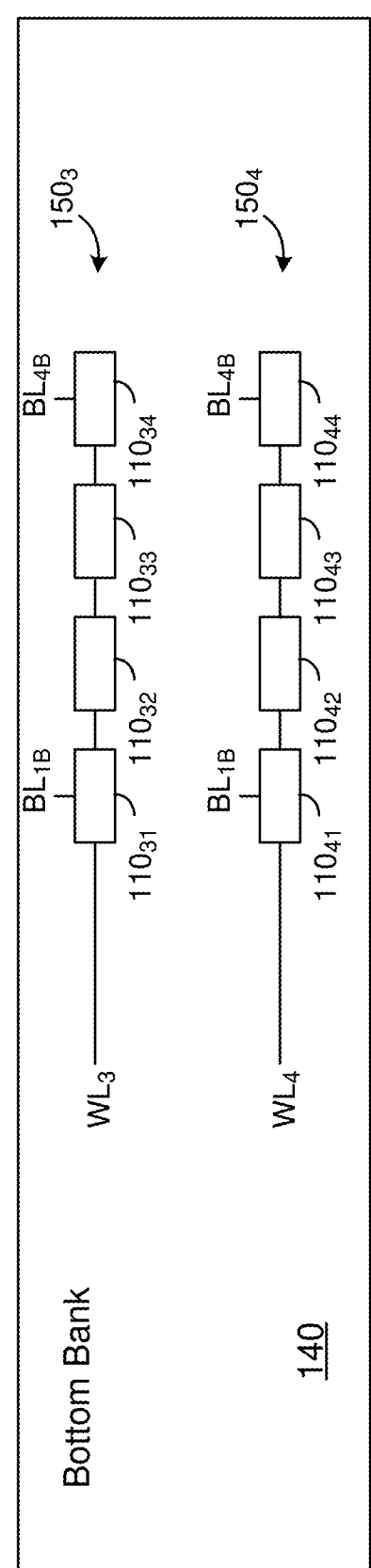

FIG. 1 is a high-level block diagram of an SRAM array 100, in accordance with one exemplary embodiment of the present disclosure. SRAM array 100 is shown as having been divided into two memory banks 130 and 140. Memory bank 130 is alternatively referred to herein as top bank 130, and memory bank 140 is alternatively referred to herein as bottom bank 140. Although SRAM array 100 is shown as including two banks, it is understood that an SRAM array, in accordance with embodiments of the present disclosure, may include any number of banks, such as 1, 2 4, and the like.

SRAM array 100 is further shown as being arranged along four rows 150$_1$, 150$_2$, 150$_3$, 150$_4$, and four columns 160$_1$, 160$_2$, 160$_3$, 160$_4$. Disposed at the intersection of each row and column is a group of SRAM cells 110$_{ij}$, where i is an index that ranges from 1 to 4 in this example and refers to the row in which the SRAM cell group is disposed, and j is an index that ranges from 1 to 4 in this example and refers to the column in which the SRAM cell group is disposed. For example, SRAM cell group 110$_{11}$ is shown as being disposed along the first row (i.e., row 150$_1$) and the first column (i.e., column 160$_1$); SRAM cell group 110$_{23}$ is shown as being disposed along the second row (i.e., row 150$_2$) and the third (i.e., column 160$_3$); and SRAM cell group 110$_{44}$ is shown as being disposed along the forth row (i.e., row 150$_4$) and the forth column (i.e., column 140$_4$).

SRAM cells disposed along rows 150$_1$ and 150$_2$ are shown as being included in top bank 130, and SRAM cells disposed along rows 150$_3$ and 150$_3$ are shown as being included in bottom bank 140. Each SRAM cell group 110$_{ij}$ includes a multitude of SRAM cells. For example, each SRAM cell group 110$_{ij}$ may include 8 SRAM cells that are accessed together during either write or read operations. It is understood that each SRAM cell group 110$_{ij}$ may include any number of SRAM cells, such as 4, 16, 32, 64, 128 or the like.

The SRAM cells disposed along the same row are addressed by the same wordline. In the example shown in FIG. 1, SRAM cells disposed along the first row are connected to and addressed by the same wordline WL$_1$; SRAM cells disposed along the second row are connected to and addressed by the same wordline WL$_2$; SRAM cells disposed along the third row are connected to and addressed by the same wordline WL$_3$; and SRAM cells disposed along the fourth row are connected to and addressed by the same wordline WL$_4$.

If each memory cell group includes, e.g., 8 SRAM cells that are selected together during a read or a write operation (i.e., the SRAM data width is 8), then each SRAM cell group includes 8 bitlines each associated with a different one of the 8 SRAM cells in the group. For clarity, the, e.g., 8 bitlines associated with each SRAM cell group are collectively identified using a single bitline in FIG. 1. For example, the bitlines associated with SRAM cell group 110$_{11}$ are collectively identified in FIG. 1 as BL$_{1T}$.

The SRAM cells positioned in the same bank and disposed along the same column share the same bitlines. Accordingly, SRAM cell groups 110$_{11}$ and 110$_{21}$ share the same bitlines collectively identified in FIG. 1 as BL$_{1T}$; SRAM cell groups 110$_{12}$ and 110$_{22}$ share the same bitlines collectively identified as BL$_{2T}$; SRAM cell groups 110$_{31}$ and 110$_{41}$ share the same bitlines collectively identified as BL$_{1B}$; SRAM cell groups 110$_{24}$ and 110$_{34}$ share the same bitlines collectively identified as BL$_{4T}$; and SRAM cell groups 110$_{34}$ and 110$_{44}$ share the same bitlines collectively identified as BL$_{4B}$.

As is described further below, the bitlines associated with the same column and disposed in different banks are applied to the same sensing circuit. For example, bitlines BL$_{1T}$ and BL$_{1B}$ of column 1 are applied to the same sensing circuit. Similarly, for example, bitlines BL$_{4T}$ and BL$_{4B}$ of column 4 are applied to the same sensing circuit. Each SRAM cell is alternatively referred to herein as a bitcell.

Figure 2:
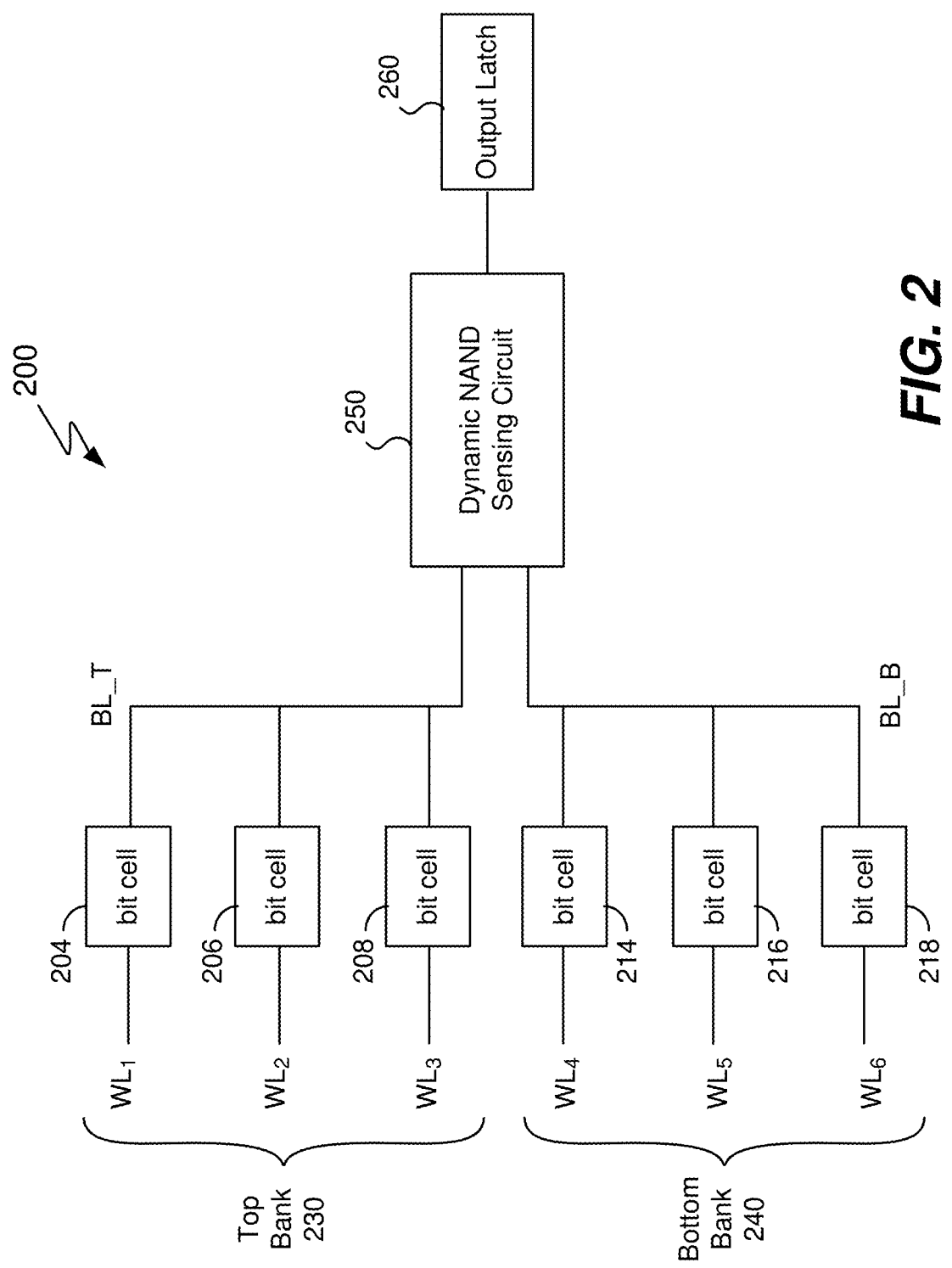
FIG. 2 is a high level block diagram of a portion of the SRAM array of FIG. 1, in accordance with one embodiment of the present disclosure.

FIG. 2 is a high level block diagram of a portion of SRAM array 200, in accordance with one embodiment of the present disclosure. SRAM array 200 is shown as including a top bank 230 and a bottom bank 240. Top bank 230 is shown as including bitcells 204, 206, 208 disposed along three different rows and the same column. Bottom bank 240 is shown as including bitcells 214, 216, 218 disposed along three different rows and along the same column as bitcells 204, 206, 208. In the example of FIG. 2, SRAM array 200 is shown as having a data width that is 1-bit wide for illustrative purposes only. It is understood that an SRAM array may have a data width of 8, 16, 32, 64, and the like, as was also described above with reference to FIG. 1. Bitcells 204, 206 and 208 of the top bank 230 are coupled to the same bitline BL_T, and Bitcells 214, 216 and 218 of the bottom bank 240 are coupled to the same bitline BL_B. Dynamic NAND sensing circuit 250 receives bitlines BL_T and BL_B, determines the stored data being sensed, and supplies the sensed data to output latch 260. In response, output latch 260 latches the stored data retrieved from the memory.

Figure 3:
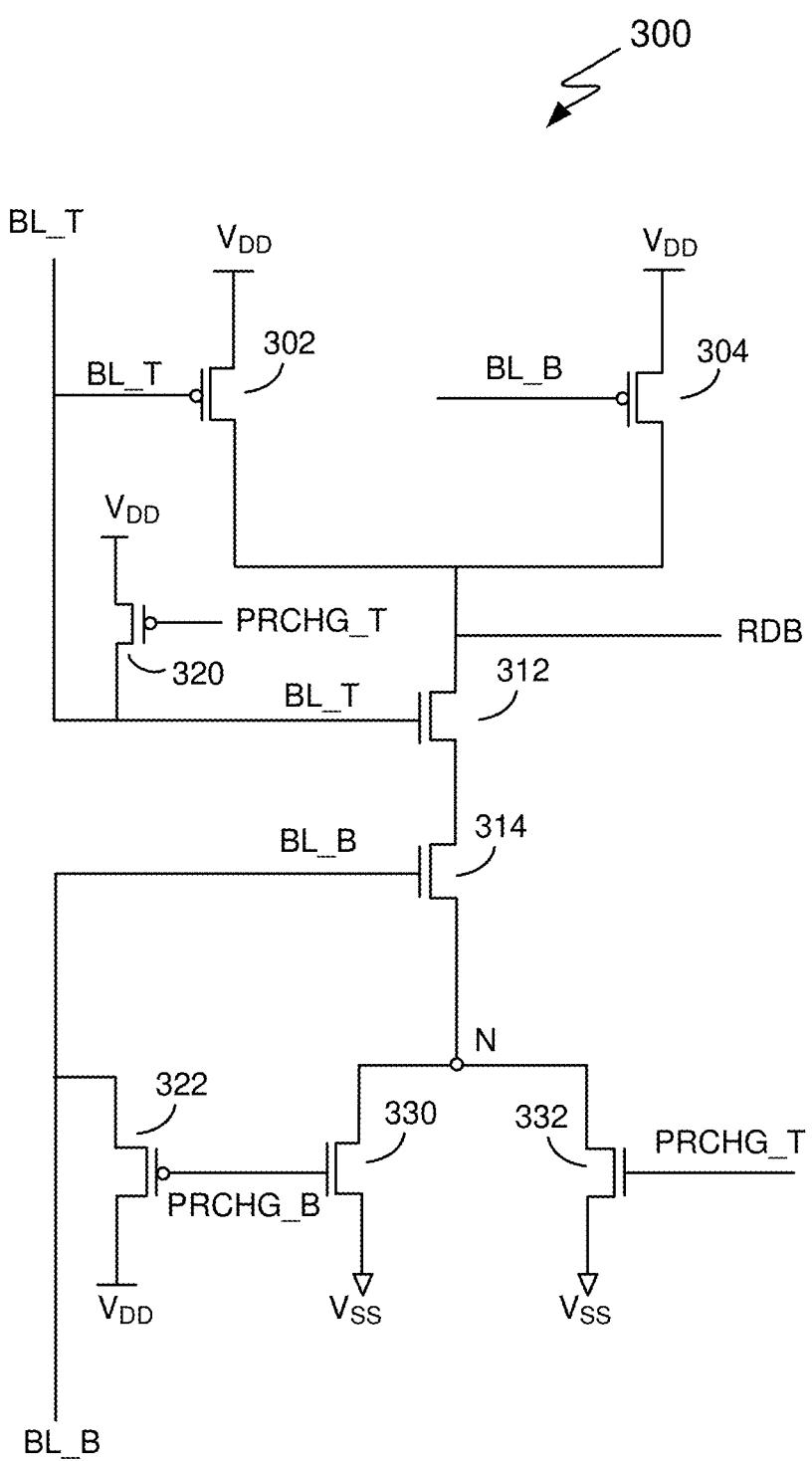
FIG. 3 is a transistor schematic diagram of a dynamic NAND sensing circuit used to perform a read operation in an SRAM array, in accordance with one embodiment of the present disclosure.

FIG. 3 is a transistor schematic diagram of a dynamic NAND sensing circuit 300, in accordance with one embodiment of the present disclosure. Dynamic NAND sensing circuit 300 is an example of dynamic NAND sensing circuit 250 shown in FIG. 2. Dynamic NAND sensing circuit (alternatively referred to herein as sensing circuit) 300 is shown as including PMOS transistors 302, 304, 320, 322 and NMOS transistors 312, 314, 330 and 332.

Bitline BL_T is coupled to the gate terminal of PMOS transistor 302, the gate terminal of NMOS transistor 312, and the drain terminal of PMOS transistor 320. Bitline BL_B is coupled to the gate terminal of PMOS transistor 304, the gate terminal of NMOS transistor 314, and the drain terminal of PMOS transistor 322. Signal PRCHG_T is applied to the gate terminals of PMOS transistor 320 and NMOS transistor 332. Signal PRCHG_B is applied to the gate terminals of PMOS transistor 322 and NMOS transistor 330. Prior to performing a read operation, signals PRECHG_T and PRECHG_B are at a low logic level (e.g., ground potential) thereby causing NMOS transistors 330 and 332 to be off, and in turn, causing the terminal supplying the $V_{SS}$ voltage to circuit 300 to float.

Referring concurrently to FIGS. 2 and 3, to perform a read operation in order to retrieve the data stored in any of the bitcells shown in FIG. 2, a read signal is generated (not shown) subsequent to which voltage $V_{DD}$ is applied to the wordline of the selected bitcell. For example, to read the data stored in bitcell 204 of FIG. 2, wordline $WL_1$ is set to the supply voltage $V_{DD}$ to select the bitcell. Signal PRCHG_T and PRCHG_B are set to the $V_{SS}$ voltage for a defined time period and prior to the start of the read operation, thereby causing NMOS transistors 330 and 332 to turn off, and PMOS transistors 320 and 322 to turn on. Accordingly, because NMOS transistors 330 and 332 are turned off, the terminal supplying the ground voltage $V_{SS}$ floats. Similarly, because PMOS transistors 320 and 322 are turned on, bitline BL_T is precharged to supply voltage $V_{DD}$ via PMOS transistor 320, and bitline BL_B is precharged to supply voltage $V_{DD}$ via PMOS_transistor 322.

Because bitcell 204 of top bank 230 is selected for the read operation in this example, signal PERCHG_B associated with bottom bank 240 remains at $V_{SS}$ thereby to maintain bitline BL_B at voltage $V_{DD}$. Accordingly NMOS transistor 314 is on and NMOS transistor 318 is off. Signal PRCHG_T associated with top bank 230 transitions to voltage $V_{DD}$ after the precharge operation. Therefore, depending on the stored data, output signal RDB is either pulled to the supply $V_{DD}$ via PMOS transistor 302, or to the ground voltage $V_{SS}$ via NMOS transistors 312, 314 and 332.

If the data stored in bitcell 204 is a logic 1, bitline BL_T remains at $V_{DD}$, thus causing the output signal RDB to discharge to the ground potential $V_{SS}$ via NMOS transistors 312, 314, and 332. Because PMOS transistor 302 is turned off when bitcell 204 stores a logic 1, signal RDB is disconnected from the supply voltage $V_{DD}$. If the data stored in bitcell 204 is a logic 0, bitline BL_T discharges to the $V_{SS}$ potential thereby causing NMOS transistor 312 to turn off and PMOS transistor 302 to turn on, in turn causing output signal RDB to charge to the $V_{DD}$ supply voltage through PMOS transistor 302.

Figures 4A, 4B:
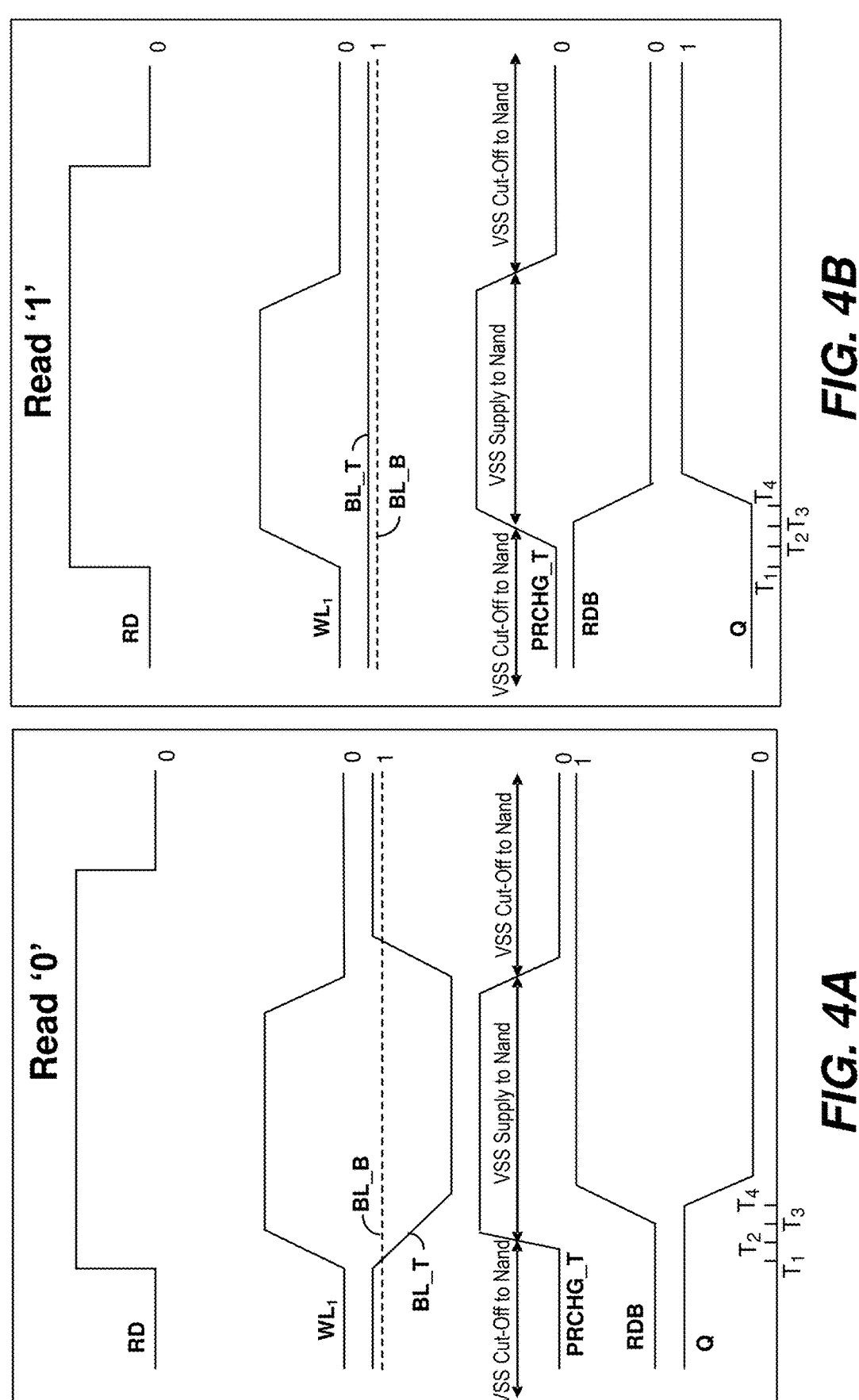
FIGS. 4A and 4B are timing diagrams of a number of signals associated with the dynamic NAND sensing circuit of FIG. 3 during read operations, in accordance with one embodiment of the present disclosure.

FIG. 4A shows the timing diagram of a number of signals associated with the sensing circuit 300 of FIG. 3 and the SRAM array shown in FIG. 2 during a read 1 operation. In FIG. 4A, it is assumed that bitcell 204 is selected for the read operation and that it was previously programmed to store a logic 1. Referring concurrently to FIGS. 3 and 4A, to perform the read operation, read signal RD is asserted. At time $T_1$, wordline $WL_1$ is increased to $V_{DD}$ level to access bitcell 204. Signal PRCHG_T remains at $V_{SS}$ level until time $T_2$ to enable bitline BL_T to precharge to $V_{DD}$ level. Thereafter signal PRCHG_T is raised to $V_{DD}$ level. Because bitcell 204 is assumed to store a logic 1, bitline BL_T remains at the $V_{DD}$ level, thereby causing NMOS transistor 312 to turn on and provide a discharge path for signal RDB to the ground through NMOS transistors 312, 314, and 332. Accordingly, signal RDB goes to $V_{SS}$ level at time $T_3$. FIG. 4A also shows that signal BL_B remains at the $V_{DD}$ voltage level during the read operation.

FIG. 4B shows the timing diagram of a number of signals associated with the sensing circuit 300 of FIG. 3 and the SRAM array shown in FIG. 2 during a read 0 operation. In FIG. 4B, it is assumed that bitcell 204 is selected for the read operation and that it was previously programmed to store a logic 0. Referring concurrently to FIGS. 3 and 4B, to perform the read operation, read signal RD is asserted. At time $T_1$, wordline $WL_1$ is increased to $V_{DD}$ level to access bitcell 204. Signal PRCHG_T remains at a low level until time $T_2$ to enable bitline BL_T to precharge to $V_{DD}$ level. Thereafter signal PRCHG_T is increased to the $V_{DD}$ level. Because bitcell 204 is assumed to store a logic 0, bitline BL_T transitions to the $V_{SS}$ level, whereas bitline BL_B remains at $V_{DD}$ level. With bitline BL_T at the $V_{SS}$ level, PMOS transistor 302 turns on and NMOS transistor 312 turns off, thereby causing signal RDB to be pulled to the $V_{DD}$ voltage level through PMOS transistor 302 at time $T_3$.

Figure 5:
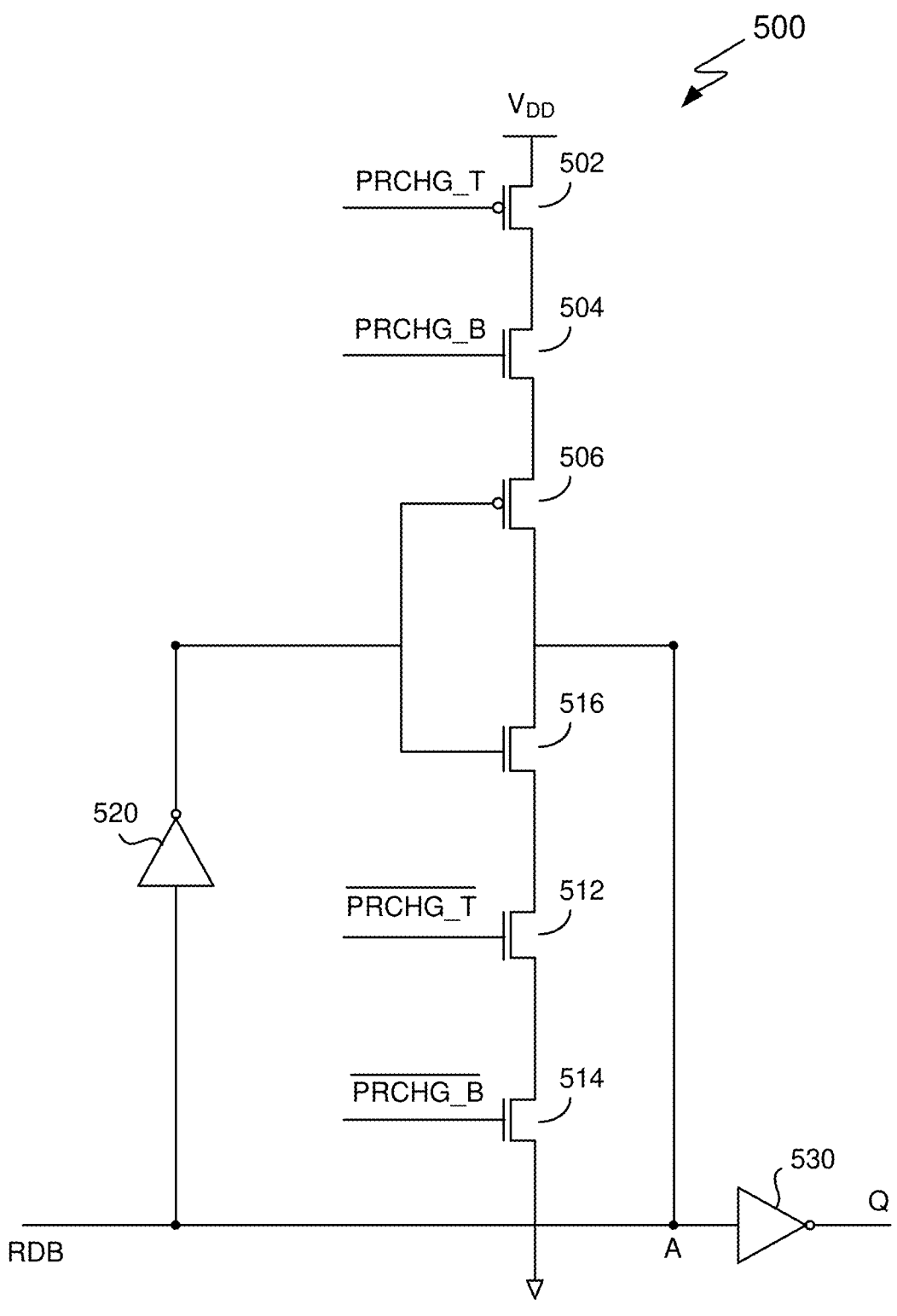
FIG. 5 is a transistor schematic diagram of a circuit adapted to latch the output of the dynamic NAND sensing circuit of FIG. 3, in accordance with one embodiment of the present disclosure.

FIG. 5 is a transistor schematic diagram of an output latch 500, in accordance with one embodiment of the present disclosure. Output latch 500 is an example of output latch 260 shown in FIG. 2. Output latch 500, which is shown as including PMOS transistors 502, 504, 506, NMOS transistor 512, 514, 516 and inverters 520, 530, is adapted to latch signal RDB to generate output signal Q. Signals PRCHG_T and PRCHG_B are respectively applied to the gate terminals of PMOS transistors 502, 504, and the complements (inverse) of signals PRCHG_T and PRCHG_B, namely $\overline{PRCHG\_T}$ and $\overline{PRCHG\_B}$ respectively, are applied to the gate terminals of NMOS transistors 512 and 514.

When the data stored in a bitcell is transferred to signal RDB, latch 500 is in the transparent mode, thus causing the complement of signal RDB to be supplied at the output of inverter 530. At the end of the read operation, signals PRCHG_T and PRCHG_B are at a logic low level, and signals $\overline{PRCHG\_T}$ and $\overline{PRCHG\_B}$ are at a logic high level, thereby causing PMOS transistors 502, 504 and NMOS transistors 512 and 514 to be on. Consequently, PMOS transistor 506 together with NMOS transistor 516 form an inverter that together with inverter 520 latch signal RDB. Inverter 530 inverts the RDB to generate signal Q, which is also shown in the waveforms of FIGS. 4A and 4B.

Figure 6:
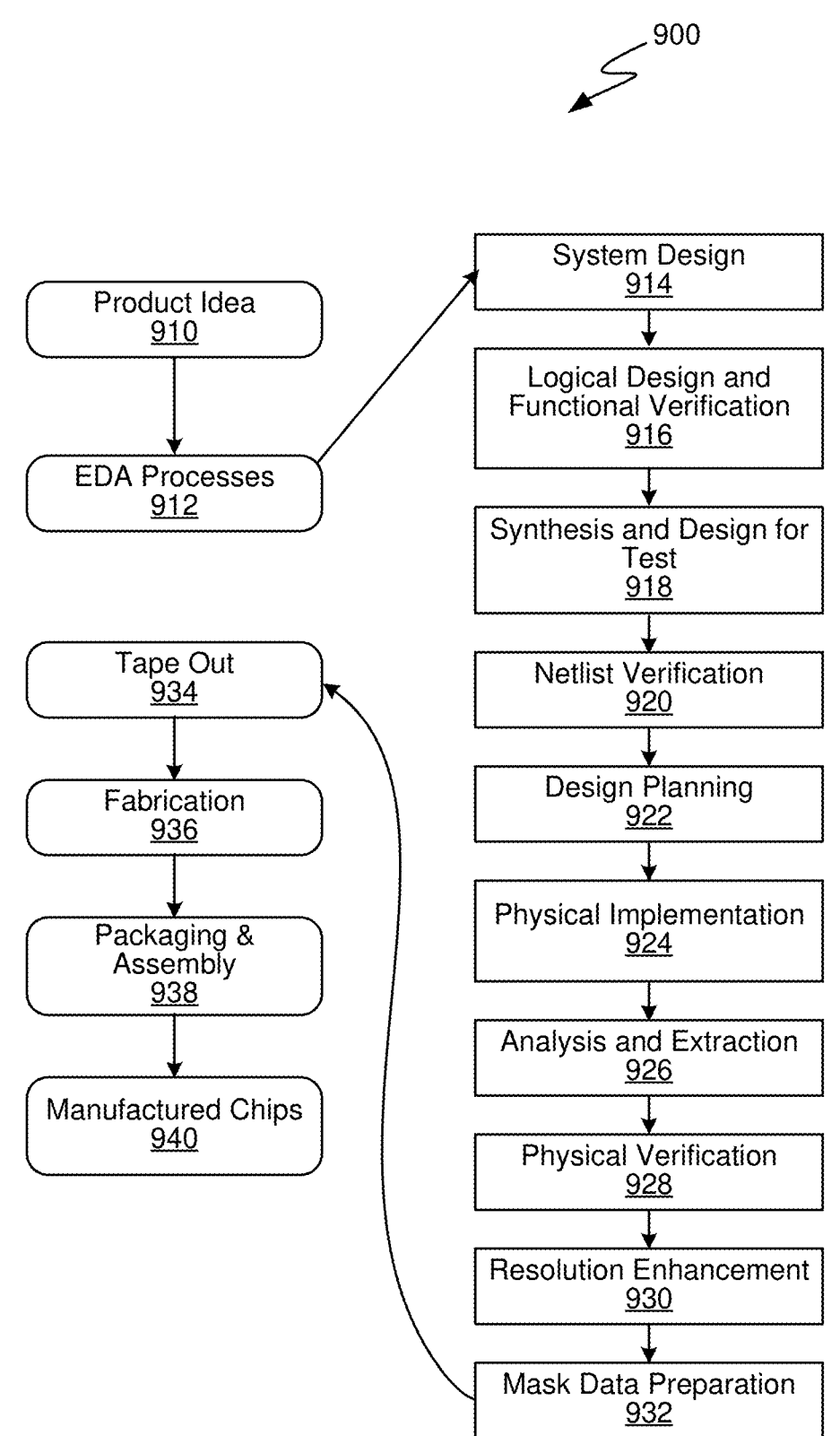
FIG. 6 depicts a flowchart of various processes used during the design and manufacture of an integrated circuit in accordance with some embodiments of the present disclosure.

FIG. 6 illustrates an example set of processes 900 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 910 with information supplied by a designer, information which is transformed to create an article of manufacture that uses a set of EDA processes 912. When the design is finalized, the design is taped-out 934, which is when artwork (e.g., geometric patterns) for the integrated circuit is sent to a fabrication facility to manufacture the mask set, which is then used to manufacture the integrated circuit. After tape-out, a semiconductor die is fabricated 936 and packaging and assembly processes 936 are performed to produce the finished integrated circuit 940.

Specifications for a circuit or electronic structure may range from low-level transistor material layouts to high-level description languages. A high-level description may be used to design circuits and systems, using a hardware description language ('HDL') such as VHDL, Verilog, System Verilog, SystemC, MyHDL or Open Vera. The HDL description can be transformed to a logic-level register transfer level ('RTL') description, a gate-level description, a layout-level description, or a mask-level description. Each lower level description adds more useful detail into the design description, for example, more details for the modules that include the description. The lower levels of description can be generated by a computer, derived from a design library, or created by another design automation process. An example of a specification language at a lower level language for specifying more detailed descriptions is SPICE, which is used for detailed descriptions of circuits with many analog components. Descriptions at each level is enabled for use by the corresponding tools of that layer (e.g., a formal verification tool). A design process may use a sequence depicted in FIG. 6. The processes described by be enabled by EDA products (or tools).

During system design 914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 920, the netlist is checked for compliance with timing constraints and for correspondence with the HDL code. During design planning 922, an overall floor plan for the integrated circuit is constructed and analyzed for timing and top-level routing.

During layout or physical implementation 924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 926, the circuit function is verified at the layout level, which permits refinement of the layout design. During physical verification 928, the layout design is checked to ensure that manufacturing constraints are correct, such as DRC constraints, electrical constraints, lithographic constraints, and that circuitry function matches the HDL design specification. During resolution enhancement 930, the geometry of the layout is transformed to improve how the circuit design is manufactured.

During tape-out, data is created to be used (after lithographic enhancements are applied if appropriate) for production of lithography masks. During mask data preparation 932, the 'tape-out' data is used to produce lithography masks that are used to produce finished integrated circuits.

A storage subsystem of a computer system (such as computer system 1100 of FIG. 8) may be used to store the programs and data structures that are used by some or all of the EDA products described herein, and products used for development of cells for the library and for physical and logical design that use the library.

Figure 7:
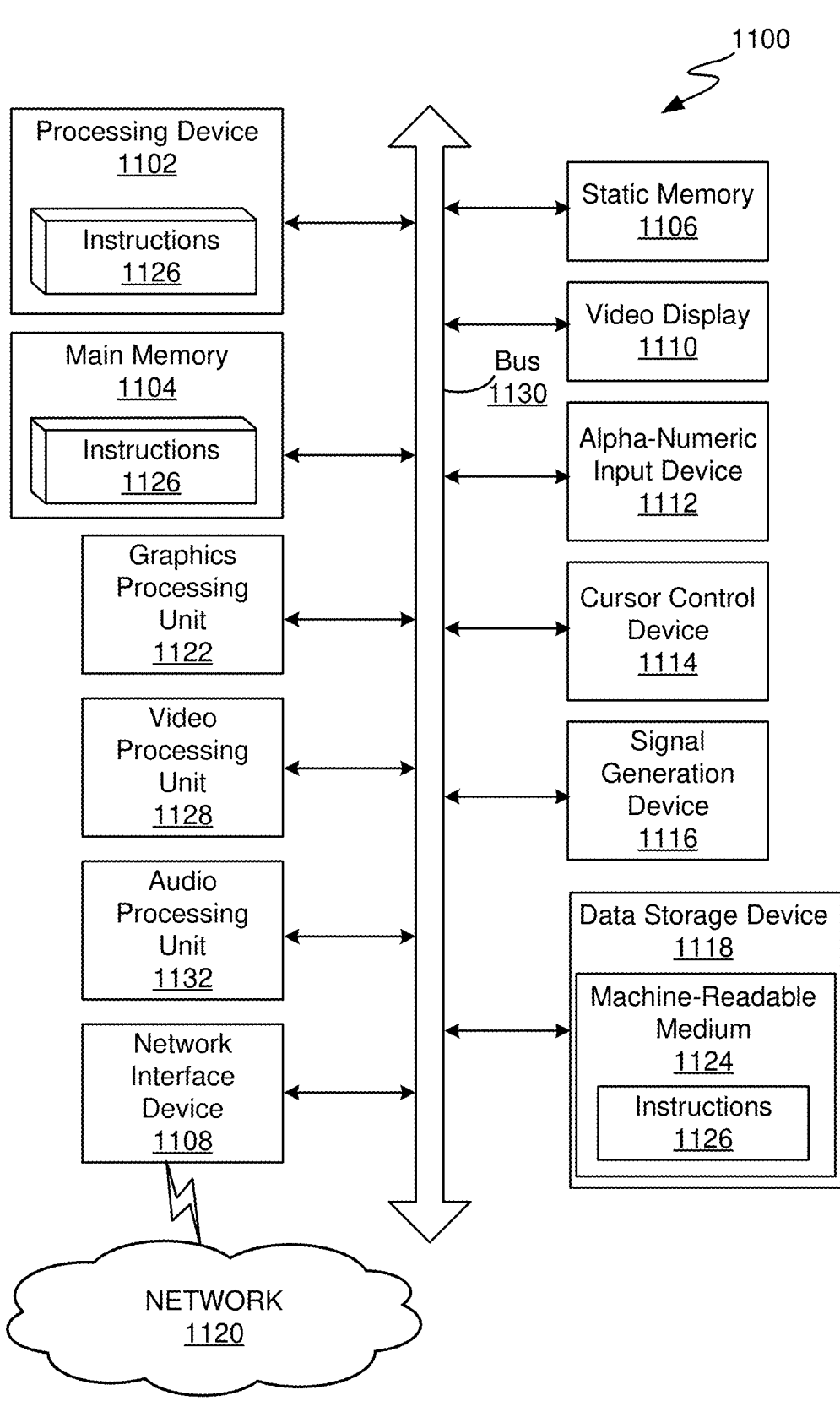
FIG. 7 depicts an example diagram of an example computer system in which embodiments of the present disclosure may operate.

FIG. 7 illustrates an example machine of a computer system 1100 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM), a static memory 1106 (e.g., flash memory, static random access memory (SRAM), etc.), and a data storage device 1118, which communicate with each other via a bus 1130.

Processing device 1102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. The processing device 1102 may be configured to execute instructions 1126 for performing the operations and steps described herein.

The computer system 1100 may further include a network interface device 1108 to communicate over the network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a graphics processing unit 1122, a signal generation device 1116 (e.g., a speaker), graphics processing unit 1122, video processing unit 1128, and audio processing unit 1132.

The data storage device 1118 may include a machine-readable storage medium 1124 (also known as a non-transitory computer-readable medium) on which is stored one or more sets of instructions 1126 or software embodying any one or more of the methodologies or functions described herein. The instructions 1126 may also reside, completely or at least partially, within the main memory 1104 and/or within the processing device 1102 during execution thereof by the computer system 1100, the main memory 1104 and the processing device 1102 also constituting machine-readable storage media.

In some implementations, the instructions 1126 include instructions to implement functionality corresponding to the present disclosure. While the machine-readable storage medium 1124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

What is claimed:

1. A circuit comprising:
   a first PMOS transistor having a source terminal coupled to a supply voltage and a gate terminal coupled to a first bitline associated with a first memory cell;
   a second PMOS transistor having a source terminal coupled to the supply voltage and a gate terminal coupled to a second bitline associated with a second memory cell;
   a first NMOS transistor having a drain terminal coupled to drain terminals of the first and second PMOS transistors and a gate terminal coupled to the first bitline;
   a second NMOS transistor having a drain terminal coupled to a source terminal of the first NMOS transistor and a gate terminal coupled to the second bitline;
   a third PMOS transistor adapted to precharge the first bitline to the supply voltage in response to assertion of a first precharge signal applied to a gate terminal of the third PMOS transistor; and
   a fourth PMOS transistor adapted to precharge the second bitline to the supply voltage in response to assertion of a second precharge signal applied to a gate terminal of the fourth PMOS transistor, wherein in response to the assertion of the first and second precharge signals, a ground terminal supplying a ground potential to the circuit is caused to float.

2. The circuit of claim 1 further comprising:
   a third NMOS transistor having a drain terminal coupled to a source terminal of the second NMOS transistor, a source terminal coupled to the ground terminal, and a gate terminal receiving the first precharge signal; and
   a fourth NMOS transistor having a drain terminal coupled to the source terminal of the second NMOS transistor, a source terminal coupled to the ground terminal, and a gate terminal receiving the second precharge signal, wherein during a read operation a first one of the first precharge or the second precharge signals remains asserted and a second one of the first precharge or the second precharge signals is deasserted.

3. The circuit of claim 2 wherein the first memory cell is disposed in a first bank of a memory array arranged along a plurality of rows and columns, wherein the second memory cell is disposed in a second bank of the memory array, wherein the first memory cell is addressable by a first wordline and the second memory array is addressable by a second wordline.

4. The circuit of claim 3 wherein the first memory cell and the second memory cell are disposed along a same column of the memory array.

5. The circuit of claim 4 further comprising:
a third memory cell disposed in the first bank, addressable by a third wordline, and coupled to the first bitline; and
a fourth memory cell disposed in the second bank, addressable by a fourth wordline, and coupled to the second bitline.

6. The circuit of claim 5 further comprising a latch adapted to latch an output signal supplied at drain terminal of the first NMOS transistor in response to the first precharge signal, the second precharge signal, a complement of the first precharge signal, and a complement of the second precharge signal.

7. The circuit of claim 6 wherein the latch comprises:
a fifth PMOS transistor having a source terminal coupled to the supply voltage and a gate terminal receiving the first precharge signal;
a sixth PMOS transistor having a source terminal coupled to a drain terminal of the fifth PMOS transistor, and a gate terminal receiving the second precharge signal;
a seventh PMOS transistor having a source terminal coupled to a drain terminal of the sixth PMOS transistor, and a gate terminal receiving the complement of the output signal;
a fifth NMOS transistor having a drain terminal coupled to a drain terminal of the seventh PMOS transistor and a gate terminal coupled to the gate terminal of the seventh PMOS transistor;
a sixth NMOS transistor having a drain terminal coupled to a source terminal of the fifth NMOS transistor, and a gate terminal receiving the complement of the first precharge signal; and
a seventh NMOS transistor having a drain terminal coupled to a source terminal of the sixth NMOS transistor, and a gate terminal receiving the complement of the second precharge signal.

8. The circuit of claim 7 wherein each of the first, second, third and fourth memory cells is a static random access memory cell.

9. A method comprising:
forming a first PMOS transistor having a source terminal coupled to a supply voltage and a gate terminal coupled to a first bitline associated with a first memory cell;
forming a second PMOS transistor having a source terminal coupled to the supply voltage and a gate terminal coupled to a second bitline associated with a second memory cell;
forming a first NMOS transistor having a drain terminal coupled to drain terminals of the first and second PMOS transistors and a gate terminal coupled to the first bitline;
forming a second NMOS transistor having a drain terminal coupled to a source terminal of the first NMOS transistor and a gate terminal coupled to the second bitline;
forming a third PMOS transistor adapted to precharge the first bitline to the supply voltage in response to assertion of a first precharge signal applied to a gate terminal of the third PMOS transistor; and
forming a fourth PMOS transistor adapted to precharge the second bitline to the supply voltage in response to assertion of a second precharge signal applied to a gate terminal of the fourth PMOS transistor, wherein in response to the assertion of the first and second precharge signals, a ground terminal supplying a ground potential to the circuit is caused to float.

10. The method of claim 9 further comprising:
forming a third NMOS transistor having a drain terminal coupled to a source terminal of the second NMOS transistor, a source terminal coupled to the ground terminal, and a gate terminal receiving the first precharge signal; and
forming a fourth NMOS transistor having a drain terminal coupled to the source terminal of the second NMOS transistor, a source terminal coupled to the ground terminal, and a gate terminal receiving the second precharge signal, wherein during a read operation a first one of the first precharge or the second precharge signals remains asserted and a second one of the first precharge or the second precharge signals is deasserted.

11. The method of claim 10 wherein the first memory cell is disposed in a first bank of a memory array arranged along a plurality of rows and columns, wherein the second memory cell is disposed in a second bank of the memory array, wherein the first memory cell is addressable by a first wordline and the second memory array is addressable by a second wordline.

12. The method of claim 11 wherein the first memory cell and the second memory cell are disposed along a same column of the memory array.

13. The method of claim 12 further comprising:
disposing a third memory cell in the first bank, wherein the third memory cell is addressable by a third wordline and is coupled to the first bitline; and
disposing a fourth memory cell in the second bank, wherein the fourth memory cell is addressable by a fourth wordline and is coupled to the second bitline.

14. The method of claim 12 further comprising:
latching an output signal supplied at drain terminal of the first NMOS transistor in response to the first precharge signal, the second precharge signal, a complement of the first precharge signal, and a complement of the second precharge signal.

15. The method of claim 14 wherein the latching of the output signal is performed by a latch that comprises:
a fifth PMOS transistor having a source terminal coupled to the supply voltage and a gate terminal receiving the first precharge signal;
a sixth PMOS transistor having a source terminal coupled to a drain terminal of the fifth PMOS transistor, and a gate terminal receiving the second precharge signal;
a seventh PMOS transistor having a source terminal coupled to a drain terminal of the sixth PMOS transistor, and a gate terminal receiving the complement of the output signal;
a fifth NMOS transistor having a drain terminal coupled to a drain terminal of the seventh PMOS transistor and a gate terminal coupled to the gate terminal of the seventh PMOS transistor;
a sixth NMOS transistor having a drain terminal coupled to a source terminal of the fifth NMOS transistor, and a gate terminal receiving the complement of the first precharge signal; and
a seventh NMOS transistor having a drain terminal coupled to a source terminal of the sixth NMOS transistor, and a gate terminal receiving the complement of the second precharge signal.

16. The method of claim 15 wherein each of the first, second, third and fourth memory cells is a static random access memory cell.

17. A non-transitory computer readable medium comprising stored instructions, which when executed by a processor, cause the processor to generate a circuit design comprising:

a first PMOS transistor having a source terminal coupled to a supply voltage and a gate terminal coupled to a first bitline associated with a first memory cell;

a second PMOS transistor having a source terminal coupled to the supply voltage and a gate terminal coupled to a second bitline associated with a second memory cell;

a first NMOS transistor having a drain terminal coupled to drain terminals of the first and second PMOS transistors and a gate terminal coupled to the first bitline;

a second NMOS transistor having a drain terminal coupled to a source terminal of the first NMOS transistor and a gate terminal coupled to the second bitline;

a third PMOS transistor adapted to precharge the first bitline to the supply voltage in response to assertion of a first precharge signal applied to a gate terminal of the third PMOS transistor; and a fourth PMOS transistor adapted to precharge the second bitline to the supply voltage in response to assertion of a second precharge signal applied to a gate terminal of the fourth PMOS transistor, wherein in response to the assertion of the first and second precharge signals, a ground terminal supplying a ground potential to the circuit is caused to float.

18. The non-transitory computer readable medium of claim 17 wherein the circuit design further comprises:

a third NMOS transistor having a drain terminal coupled to a source terminal of the second NMOS transistor, a source terminal coupled to the ground terminal, and a gate terminal receiving the first precharge signal; and a fourth NMOS transistor having a drain terminal coupled to the source terminal of the second NMOS transistor, a source terminal coupled to the ground terminal, and a gate terminal receiving the second precharge signal, wherein during a read operation a first one of the first precharge or the second precharge signals remains asserted and a second one of the first precharge or the second precharge signals is deasserted.

19. The non-transitory computer readable medium of claim 18 wherein the first memory cell is disposed in a first bank of a memory array arranged along a plurality of rows and columns, wherein the second memory cell is disposed in a second bank of the memory array, wherein the first memory cell is addressable by a first wordline and the second memory array is addressable by a second wordline.

20. The non-transitory computer readable medium of claim 19 wherein the first memory cell and the second memory cell are disposed along a same column of the memory array.

\* \* \* \* \*